(12) United States Patent
Moon

(10) Patent No.: US 6,256,218 B1
(45) Date of Patent: Jul. 3, 2001

(54) INTEGRATED CIRCUIT MEMORY DEVICES HAVING ADJACENT INPUT/OUTPUT BUFFERS AND SHIFT BLOCKS

(75) Inventor: Byong-mo Moon, Seoul (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 09/466,536

(22) Filed: Dec. 17, 1999

(30) Foreign Application Priority Data

Dec. 17, 1998 (KR) .................................................. 98-55735

(51) Int. Cl.[7] .................................................... K11C 5/06
(52) U.S. Cl. .................. 365/63; 365/230.03; 365/230.08
(58) Field of Search ............................... 365/63, 230.03, 365/230.08, 233, 240

(56) References Cited

U.S. PATENT DOCUMENTS

| | | | |
|---|---|---|---|
| 5,473,575 | 12/1995 | Farmwald et al. | 365/230.06 |
| 5,578,940 | 11/1996 | Dillon et al. | 326/30 |
| 5,606,717 | 2/1997 | Farmwald et al. | 395/856 |
| 5,663,661 | 9/1997 | Dillon et al. | 326/30 |
| 5,936,875 | 8/1999 | Kim et al. | 365/51 |
| 5,959,928 | 9/1999 | Oh et al. | 365/230.03 |
| 5,995,404 | * 10/1999 | Nakaumura et al. | 365/63 |

FOREIGN PATENT DOCUMENTS

| | | |
|---|---|---|
| 3-46192 | 2/1991 | (JP) . |
| 4-89695 | 3/1992 | (JP) . |

* cited by examiner

Primary Examiner—David Nelms
Assistant Examiner—David Lam
(74) Attorney, Agent, or Firm—Myers Bigel Sibley & Sajovec

(57) ABSTRACT

An integrated circuit memory device is provided which includes input buffers placed adjacent an associated input shift block rather than displaced with intervening regions, such as a pad block, between the buffer and the shift block. As a result, a single input clock line may be provided which can support both the input buffers and the shift block. The single line may also provide less loading allowing a lower power driver in the memory device's clock circuit. In addition, the input clock line may avoid routing through the pad block which in turn may reduce noise on the input clock line from signals in the pad block. The output buffers and associated shift block may also be located adjacent each other on the on the integrated circuit memory device to allow similar benefits on the output clock side of the memory device. Accordingly, memory devices are provided which may consume less power and be reduced in size. The integrated circuit memory device may be a Rambus DRAM.

20 Claims, 3 Drawing Sheets

INTEGRATED CIRCUIT MEMORY DEVICES HAVING ADJACENT INPUT/OUTPUT BUFFERS AND SHIFT BLOCKS

FIELD OF THE INVENTION

The present invention relates to integrated circuit devices, and, more particularly, to integrated circuit memory devices.

BACKGROUND OF THE INVENTION

A dynamic random access memory (DRAM) is a type of integrated circuit device. High speed integrated circuit devices are often used, for example, in signal processing applications where conventional DRAM access speeds may be insufficient. High speed integrated circuit memory devices typically input and output data in-synchronization with an externally applied clock signal. For example, in a high speed integrated circuit memory device, data input and output operations may utilize an internal input and output clock signal. Recently, however, in order to achieve high speed operations and/or other advantages, other types of integrated circuit memory devices have been provided. Examples of such memory devices include a fast page mode DRAM, an extended data output (EDO) DRAM, a synchronous DRAM, a double data rate (DDR) DRAM, and a Rambus DRAM have been developed. The operating speed of the memory device is generally increased under various conditions with each of the above DRAMs by increasing the amount of input and output data (bandwidth) accessed per unit time.

Rambus DRAM technology is marketed by Rambus, Inc., Mountain View, Calif. The Rambus technology is described in U.S. Pat. No. 5,473,575 to Farmwald et al., U.S. Pat. No. 5,578,940 to Dillon et al., U.S. Pat. No. 5,606,717 to Farmwald et al. and U.S. Pat. No. 5,663,661 to Dillon et al. A device embodying the Rambus technology is also referred to as a "packet type integrated circuit device", because each integrated circuit receives data and addresses in packet units.

An example of a conventional Rambus DRAM integrated circuit device is illustrated in FIG. 1. As shown in FIG. 1, the Rambus memory device 101 includes first memory bank 181 and a second memory bank 182. It also includes a first input and output shift block 111, a second input and output shift block 112, an interface logic unit 121, a first input and output buffer 131, a second input and output buffer 132, a delay locked loop circuit 141 and a pad block 151.

In the conventional Rambus memory device 101, the first and second input and output buffers 131, 132 are located in the integrated circuit device substrate displaced (isolated) from the first and second input and output shift blocks 111, 112. Typically, the distance between each of the first and second input and output buffers 131, 132 and the first input and output shift block 111 is about 1000 micrometers ($\mu$m) to 4000 $\mu$m. The distance between each of the first and second input and output buffers 131, 132 and the second input and output shift block 112 is also typically about 1000 $\mu$m to 4000 $\mu$m. Accordingly, the output drivers (not shown) of the first and second input buffers included, respectively, in the first and second input and output buffers 131, 132 generally are designed so as to be able to transmit data from the respective first and second input buffers to the corresponding first and second input shift blocks included in the first and second input and output shift blocks 111, 112. The output drivers (not shown) of the first and second output shift blocks included in the first and second input and output shift blocks 111, 112 are also typically designed to have the capability to transmit data from the first and second output shift blocks to the corresponding first and second output buffers included in the first and second input and output buffers 131, 132.

As a result of the distances that the drivers are required to support, an undesirably large amount of power is typically consumed by the first and second input buffers and the first and second output shift blocks. In addition, as a result of the length of the data lines 171–174 used for data transmission between the first and second input and output buffers 131, 132 and the first and second input and output shift blocks 111, 112, data may be affected by noise.

In a further aspect of the conventional Rambus DRAM illustrated in FIG. 1, the delay locked loop circuit 141 generates an input control clock signal (sclk) and an output control clock signal (tclk). The input control clock signal (sclk) controls the input buffers included in the first and second input and output buffers 131, 132 and the input shift circuits included in the first and second input and output shift blocks 111, 112. The output control clock signal (tclk) controls the output buffers included in the first and second input and output buffers 131, 132 and the output shift circuits included in the first and second input and output shift blocks 111, 112. Respective clock lines 161–166 provide the input and output control clock signals (sclk) and (tclk) to the first and second input and output buffers 131, 132 and the first and second input and output shift blocks 111, 112 The clock lines 161–166 are placed in three pairs adjacent to the first and second input and output buffers 131, 132, the first input and output shift block 111, and the second input and output shift block 112 respectively.

As a result of the number of clock lines, the loads on the output drivers of the delay locked loop circuit 141 which drives the clock lines 161-166 are typically increased. This loading, in turn typically causes the delay locked loop circuit 141 to consume an increasing amount of power and may require a greater amount of area in the integrated circuit device. Correspondingly, the Rambus memory device 101 also may require a greater amount of area to implement resulting in a larger device.

As shown in FIG. 1, the clock lines 165 and 166 are installed between particular pads among a plurality of pads included in the pad block 151. As a result, a significant amount of noise may be generated in the input and output control clock signals (sclk) and (tclk), passing between the particular pads, due to interference caused by signals applied to the particular pads in the proximity of the clock lines 165, 166.

The data lines 173 and 174 for transmitting data between the first and second input and output buffers 131, 132 and the second input and output shift block 112 are positioned with a portion passing through the pad block 151 as a result of the placement of the pad block 151 between the circuits being connected by the data lines 173, 174. This layout may also contribute to increasing the size of the Rambus memory device. In addition, as with the clock signals, signals transmitted via the data lines 173, 174 may be subjected to interference from signals applied to pads included in the pad block 151 in the vicinity of the data lines 173, 174. This noise could lead to instability on the data lines 173, 174.

Accordingly, there is a need for improved integrated circuit memory devices such as Rambus DRAMs.

SUMMARY OF THE INVENTION

It is, therefore, an object of the present invention to provide integrated circuit memory devices which may consume less power.

It is a further object of the present invention to provide integrated circuit memory devices which may be less susceptible generation of noise on clock lines of the integrated circuit memory device.

These and other objects may be provided by integrated circuit memory devices which include input buffers placed adjacent an associated input shift block rather than displaced with intervening regions, such as a pad block, between the buffer and the shift block. As a result, a single input clock line may be provided which can support both the input buffers and the shift block. The single line may also provide less loading allowing a lower power driver in the memory device's clock circuit. In addition, the input clock line may avoid routing through the pad block which in turn may reduce noise on the input clock line from signals in the pad block. The output buffers and associated shift block may also be located adjacent each other on the on the integrated circuit memory device to allow similar benefits on the output clock side of the memory device. Accordingly, memory devices are provided which may consume less power and be reduced in size.

In one embodiment of the present invention, an integrated circuit memory device is provided which includes a memory bank in an integrated circuit substrate. A pad block and a plurality of input buffers are also included in the integrated circuit substrate that buffer data input to the pad block. An input shift block coupled to the plurality of input buffers provides data from the plurality of input buffers to the memory bank. The input shift block is adjacent the input buffers in the integrated circuit substrate. In a further embodiment a clock circuit is provided in the integrated circuit substrate adjacent at least one of the input buffers and the input shift block. The clock circuit has an input control clock output. An input control clock line on the integrated circuit substrate extends from the input control clock output and is positioned adjacent the input buffers and the input shift block. Preferably, the input control clock line does not pass over the pad block. The input buffers and the input shift block preferably have a clock input that is responsive to the input control clock line In another embodiment of the present invention, an integrated circuit memory device is provided that further includes a plurality of output buffers in the integrated circuit substrate that buffer data for output to the pad block. An output shift block is coupled to the plurality of output buffers that provides data from the memory bank to the plurality of output buffers. An output control clock line on the integrated circuit substrate extends from an output control clock output of the clock circuit and is positioned adjacent the output buffers and the output shift block. Preferably, the output buffers and the output shift block have a clock input that is responsive to the output control clock line. The clock circuit may be a delay locked loop circuit.

In a further embodiment of the present invention, the input buffers and input shift block define a first input buffer/shift block and the output buffers and output shift block define a first output buffer/shift block. The first input buffer/shift block and the first output buffer/shift block are associated with the first memory bank. The integrated circuit memory device further includes a second memory bank and a second input buffer/shift block associated with the second memory bank and having a clock input that is responsive to the input clock line. A second output buffer/shift block is associated with the second memory bank which has a clock input that is responsive to the output clock line. The input control clock line is positioned adjacent the second input buffer/shift block and the output control clock line is positioned adjacent the second output buffer/shift block. Preferably, the first output buffer/shift block is adjacent the second output buffer/shift block and the delay locked loop circuit is between the first input buffer/shift block and the second input buffer/shift block.

In another embodiment of the present invention, the pad block is between the first and second output buffer/shift blocks and the first and second input buffer/shift blocks. The output clock line in one embodiment does not pass over the pad block. The first input buffer/shift block and the first output buffer/shift block may define a first input/output block and the second input buffer/shift block and the second output buffer/shift block may define a second input/output block and the delay locked loop circuit may be positioned between the first input/output block and the second input/output block. The integrated circuit memory device may be a Rambus memory device.

In a further aspect of the present invention a Rambus memory device is provided including a first and a second memory bank in an integrated circuit substrate. A pad block in the integrated circuit substrate is between the first memory bank and the second memory bank. A first input buffer/shift block including a plurality of input buffers in the integrated circuit substrate coupled to the pad block buffers data input to the pad block and an input shift block coupled to the plurality of input buffers that provides data from the plurality of input buffers to the first memory bank. The first input buffer/shift block is between the first memory bank and the pad block. A second input buffer/shift block is electrically coupled to the second memory bank and includes a plurality of input buffers in the integrated circuit substrate coupled to the pad block that buffer data input to the pad block and an input shift block coupled to the plurality of input buffers that provides data from the plurality of input buffers to the second memory bank. The second input buffer/shift block is between the first memory bank and the pad block. A delay locked loop circuit is provided in the integrated circuit substrate between the first memory bank and the pad block which has an input control clock output. An input control clock line on the integrated circuit substrate extends from the input control clock output. The input control clock line extends between the first memory block and the pad block.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout and signal lines and signals thereon may be referred to by the same reference symbols. Each embodiment described and illustrated herein includes its complementary conductivity type embodiment as well. It is further to be understood that the size of various regions as illustrated in the figures is for the purposes of explanation and may be exaggerated for the sake of clarity.

Figure 1:
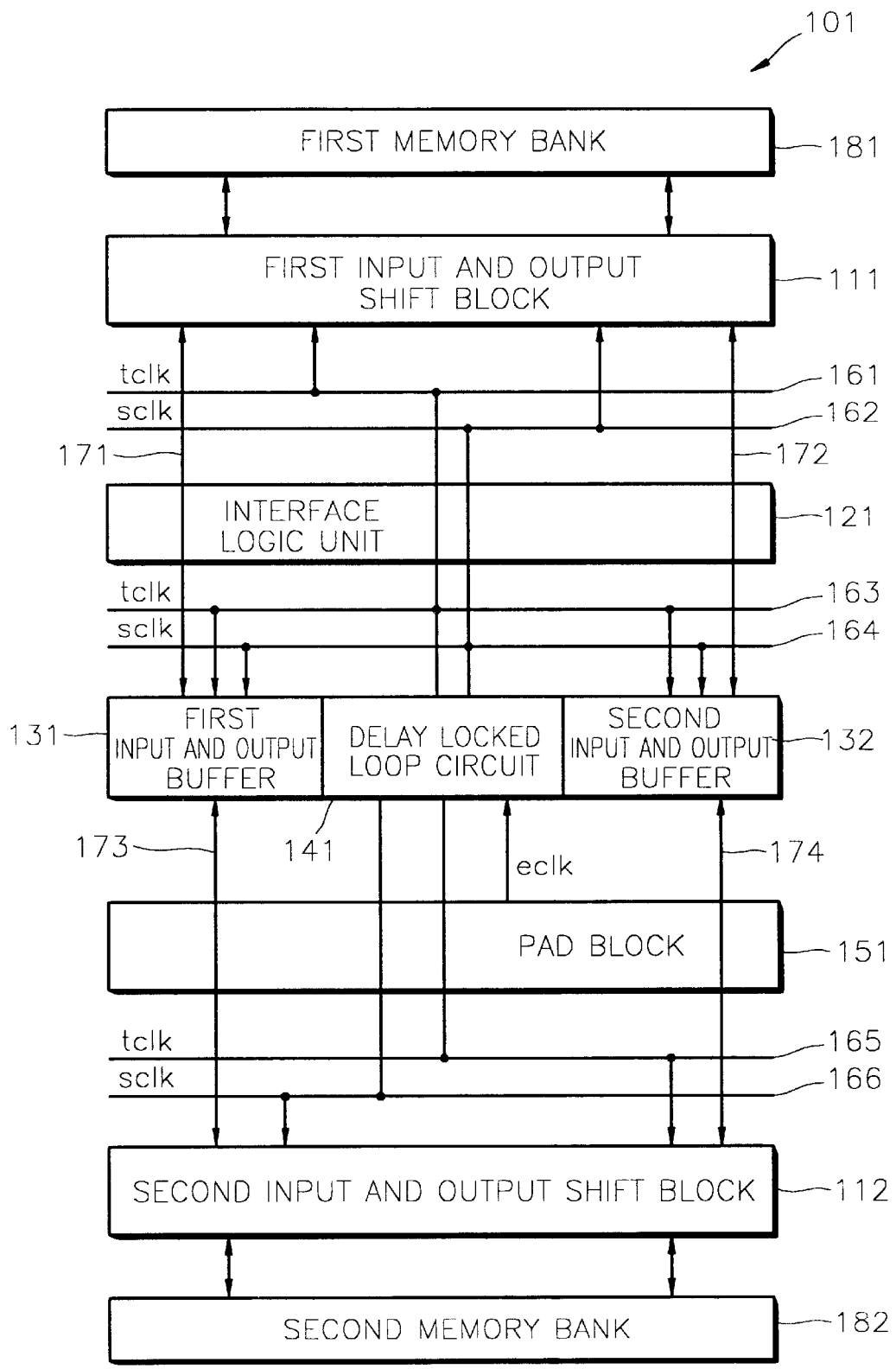
FIG. 1 is a schematic block diagram illustrating a Rambus DRAM according to the prior art.
Figure 2:
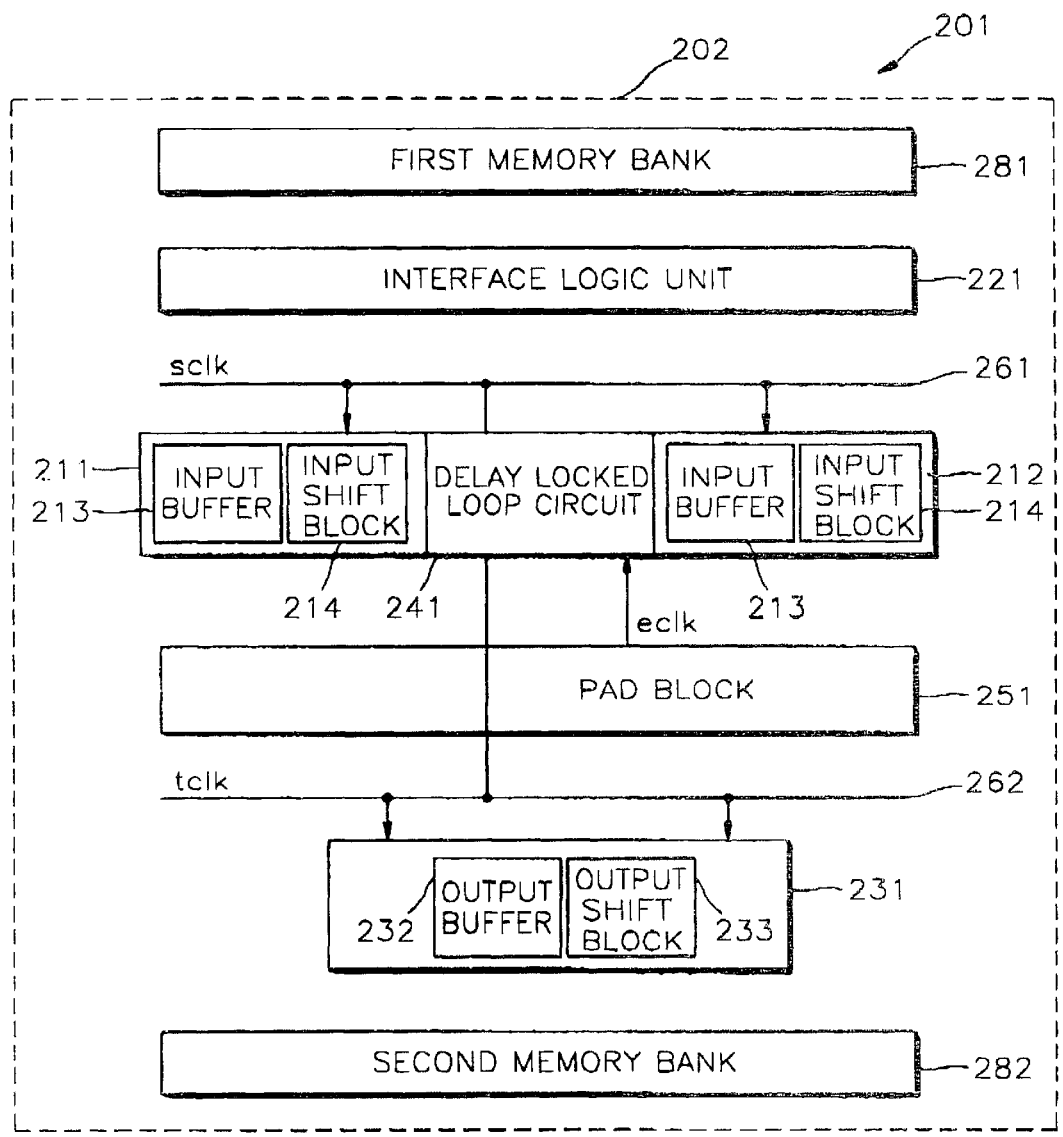
FIG. 2 is a schematic block diagram illustrating an integrated circuit memory device according to an embodiment of the present invention.

Referring now to FIG. 2, an integrated circuit memory device, more particularly, a Rambus memory device 201 according to a first embodiment of the present invention will be described. The Rambus memory device 201 includes a first memory bank 281, a second memory bank 282, an interface logic unit 221, first and second input buffers/input shift blocks 211 and 212, a delay locked loop circuit 241, a pad block 251, and an output buffer/output shift block 231 in an integrated circuit substrate 202. The first and second input buffers/input shift blocks 211 and 212 each include a plurality of input buffers 213 and a plurality of input shift blocks 214 supporting the respective buffer and shift block aspects of these circuits. The output buffer/output shift block 231 similarly includes a plurality of output buffers 232 and a plurality of output shift blocks 233.

The pad block 251 in the embodiment of FIG. 2 includes a plurality of pads. External data or signals are applied to respective ones of the pads among the plurality of pads in order to write external data (such as from a processor) to the first and second memory banks 281, 282. The data applied to the pads is stored in the first and second memory banks 281 and 282 via the first input buffer/input shift block 211 or the second input buffer/input shift block 212 under the control of the interface logic unit 221. The Rambus memory device 201 thereby supports write operations.

Similarly, data stored in the first and second memory banks 281 and 282 may be transferred to pads in the pad block 251 for output (such as to a processor) via the output buffer/output shift block 231 under the control of the interface logic unit 221. The Rambus memory device 201 thereby supports read operations.

The first memory bank 281, the interface logic unit 221, the first and second input buffer/input shift blocks 211 and 212, the pad block 251, the output buffer/output shift block 231, and the second memory bank 282 in the illustrated embodiment of FIG. 2 are sequentially arranged along an axis, shown as a vertical axis in FIG. 2. In other words, for example, the pad block 251 is positioned adjacent the output buffer/output shift block 231 and between the output buffer/output shift block 231 and the first input buffer/input shift block 211. The delay locked loop circuit 241 is positioned adjacent to and between the first input buffer/input shift block 211 and the second input buffer/input shift block 212. It is to be understood, however, that the sequence of the layout may be changed according to the characteristics of the Rambus memory device 201 while still falling within the scope of the present invention.

The delay locked loop circuit 241 illustrated in FIG. 2 receives an external clock signal (eclk) from the pad block 251 and generates an internal input control clock signal (sclk) and an internal output control clock signal (tclk), for example, by stabilizing the frequency of the external clock signal (eclk). The first and second input buffers/input shift blocks 211, 212 preferably operate in synchronization with the input control clock signal (sclk), and the output buffer/output shift block 231 preferably operates in synchronization with the output control clock signal (tclk). In the embodiment of FIG. 2, the input control clock signal (sclk) is provided to the first and second input buffers/input shift blocks 211, 212 via a clock line 261. The output control clock signal (tclk) is similarly provided to the output buffer/output shift block 231 via another clock line 262. Accordingly, in the embodiments of FIG. 2, the clock line 261 is positioned adjacent to the first and second input buffers/input shift blocks 211, 212 while the clock line 262 is positioned adjacent to the output buffer/output shift block 231.

As described above, a plurality of input buffers are positioned adjacent to a plurality of input shift blocks, and a plurality of output buffers are positioned adjacent to a plurality of output shift blocks, such that only one line is required in the embodiment of FIG. 2 for the clock line 261 for transmitting the input control clock signal (sclk) and for the clock line 262 for transmitting the output control clock signal (tclk). Therefore, the load on the delay locked loop circuit 241 for driving the input and output control clock signals (sclk) and (tclk) may be reduced, and the output drivers of the delay locked loop circuit 241 may correspondingly be reduced in size. Furthermore, a reduction in power consumption by the delay locked loop circuit 241 may also reduce the size of the delay locked loop circuit 241. This may also reduce the power consumption and size of the Rambus memory device 201.

The adjacent lay-out between the plurality of input buffers and the plurality of input shift blocks in the respective input buffer/input shift blocks 211, 212 may shorten the data lines for connecting the plurality of input buffers in the respective input buffer/input shift blocks 211, 212 to the plurality of input shift blocks in the respective input buffer/input shift blocks 211, 212. Similarly, the adjacent lay-out between the plurality of output buffers and the plurality of output shift blocks in the output buffer/output shift block 231 may also shorten the data lines for connecting the plurality of output buffers in the output buffer/output shift block 231 to the plurality of output shift blocks in the output buffer/output shift block 231. This, in turn, may allow a reduction in the size of the output drivers of various buffers and shift blocks which may provide for less power consumption and a smaller size for the Rambus memory device 201.

A further aspect of the present invention is provided by positioning of the plurality of input buffers in the respective input buffer/input shift blocks 211, 212 adjacent to the plurality of input shift blocks in the respective input buffer/input shift blocks 211, 212 as the clock line 261 for the input control clock signal (sclk) does not pass through the pad block 251. Accordingly, the potential for noise on the clock line 261 may be reduced.

As shown in the embodiment of FIG. 2, the Rambus memory device 201 includes two memory banks 281, 282, a first and second input buffers/input shift blocks 211, 212 and an output buffer/output shift block 231. However, it is to be understood that the present invention is not so limited and may also be applied to a variety of different integrated circuit memory devices as known to those of skill in the art with more memory banks or with a single memory bank.

Figure 3:
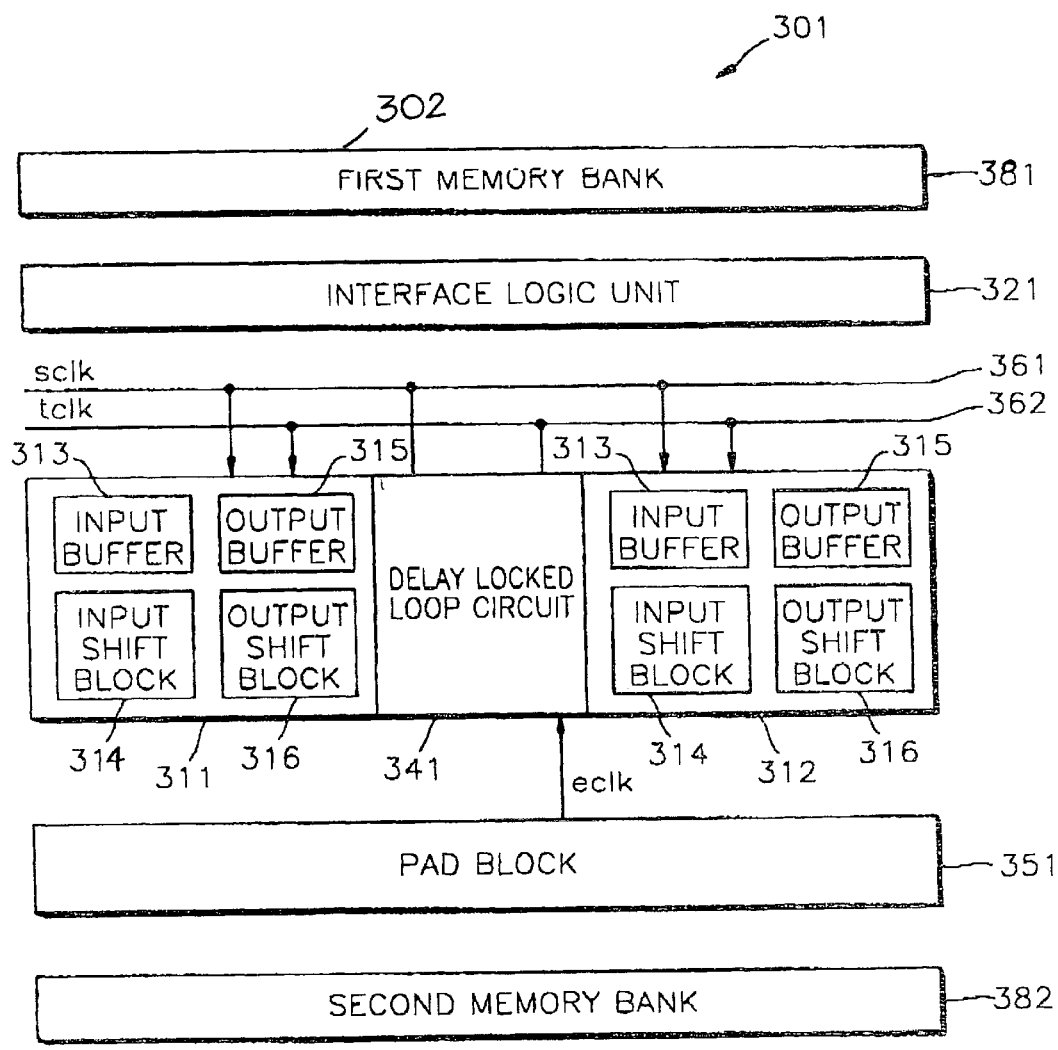
FIG. 3 is a schematic block diagram illustrating an integrated circuit memory device according to another embodiment of the present invention.

Referring now to FIG. 3, an integrated circuit memory device, more particularly, a Rambus memory device 301 according to a second embodiment of the present invention will be described. The Rambus memory device 301 includes a first memory bank 381 and a second memory bank 382, an interface logic unit 321, first and second input and output buffers/input and output shift blocks 311, 312, a delay locked loop circuit 341, and a pad block 351 in an integrated circuit substrate 302. The first and second input and output buffers/input and output shift blocks 311, 312 each include a plurality of input buffers 313, a plurality of output buffers 315, a plurality of input shift blocks 314, and a plurality of output shift blocks 316. In other words, both the input and output buffers and shift blocks are combined in FIG. 3 as contrasted with the embodiment of FIG. 2 where the output buffer/output shift block 231 is positioned on the opposite side of the pad block 251 from the delay locked loop circuit 241.

The pad block 351 preferably includes a plurality of pads. External data is applied to respective ones of the pads to write the external data (such as data from a processor) to the first memory bank 381 and the second memory bank 382. The data applied to the pad is transferred to the first memory bank 381 via the first input and output buffer/input and output shift block 311 and/or the second memory bank 382 via the second input and output buffer/input and output shift block 312 under the control of the interface logic unit 321. Accordingly, write operations are supported by the Rambus memory device 301.

Data stored in the first memory bank 381 is transferred to the pad via the first input and output buffer/input and output shift block 311 and data stored in the second memory banks 382 is transferred to the pad via the second input and output buffer/input and output shift block 312 under the control of the interface logic unit 321. Data transferred to the pad is the transmitted to the outside (such as a processor) to provide for read operations from the first and second memory banks 381, 382 of the Rambus memory device 301.

The first memory bank 381, the interface logic unit 321, the first and second input and output buffers/input and output shift blocks 311, 312, the pad block 351, and the second memory bank 382 in the illustrated embodiment of FIG. 3 are sequentially arranged along an axis, shown as a vertical axis in FIG. 3. In other words, for example, the pad block 351 is positioned between the second memory bank 382 and the delay locked loop circuit 341. The delay locked loop circuit 341 is positioned adjacent to and between the first input and output buffer/input and output shift block 311 and the second input and output buffer/input and output shift block 312. It is to be understood, however, that the sequence of the lay-out may be changed according to the characteristics of the Rambus memory device 301 while still falling within the scope of the present invention.

The delay locked loop circuit 341 illustrated in FIG. 3 receives an external clock signal (eclk) from the pad block 351 and generates an internal input control clock signal (sclk) and an output control clock signal (tclk), for example, by stabilizing the frequency of the external clock signal (eclk). The input control clock signal (sclk) is provided to a plurality of input buffers and a plurality of input shift blocks included in each of the first and second input and output buffers/input and output shift blocks 311, 312 via a clock line 361. The output control clock signal (tclk) is similarly provided to a plurality of output buffers and a plurality of output shift blocks included in each of the first and second input and output buffers/input and output shift blocks 311, 312 via another clock line 362. Accordingly, in the embodiment of FIG. 3, the clock lines 361, 362 are positioned adjacent to the first and second input and output buffers/input and output shift blocks 311,312.

As described above, a plurality of input buffers is positioned adjacent to a plurality of input shift blocks, and a plurality of output buffers are positioned adjacent to a plurality of output shift blocks, such that only one line is required in the embodiment of FIG. 3 for the clock line 361 for transmitting the input control clock signal (sclk) and for the clock line 362 for transmitting the output control clock signal (tclk). Therefore, the load on the delay locked loop circuit 341 for driving the input and output control clock signals (sclk) and (tclk) may be reduced, and the output drivers of the delay locked loop circuit 341 may correspondingly be reduced in size. Furthermore, a reduction in power consumption by the delay locked loop circuit 341 may also reduce the size of the delay locked loop circuit 341. This may also reduce the power consumption and size of the Rambus memory device 301.

The adjacent lay-out of the plurality of input buffers and the plurality of input shift blocks and the plurality of output buffers and the plurality of output shift blocks in the respective first and second input and output buffers/input and output shift blocks 311, 312 may also shorten the data lines for connecting the plurality of input buffers to the plurality of input shift blocks and the plurality of output buffers to the plurality of output shift blocks. This, in turn, may allow a reduction in the size of the output drivers of the plurality of input buffers and the output drivers of the plurality of output shift blocks which may provide for less power consumption and a smaller size for the Rambus memory device 301.

In a further aspect of the present invention, the adjacent placement of the plurality of input buffers relative to the plurality of input shift blocks and the adjacent placement of the plurality of output buffers relative to the plurality of output shift blocks provides for a routing of the clock lines 361 and 362 which does not pass over (through) the pad block 351. Accordingly, the potential for nose on the input and output control clock signals (sclk) and (tclk) due to the interference of signals applied to the pad block 351 is reduced.

As shown in the embodiment of FIG. 3, the Rambus memory device 301 includes two memory banks 381, 382 and two input and output buffers/input and output shift blocks 311, 312. However, it is to be understood that the present invention is not so limited and may also be applied to a variety of different integrated circuit memory devices as known to those of skill in the art with more memory banks or with a single memory bank.

According to the present invention as described above, a plurality of input buffers are provided adjacent to a plurality of input shift blocks and a plurality of output buffers are provided adjacent to a plurality of output shift blocks, or the plurality of input buffers, the plurality of input shift blocks, the plurality of output buffers, and the plurality of output shift blocks are all arranged adjacent to each other. Accordingly, the number of clock lines may be reduced, the loads on the output drivers of a delay locked loop circuit generating input and output clocks may be reduced, and the loads on the output drivers of the plurality of input buffers and output shift blocks may also be reduced. As a result, the total power consumption of the Rambus memory devices 201, 301 may be reduced and the Rambus memory devices 201, 301 may also be reduced in size.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device comprising:
   a memory bank in an integrated circuit substrate;
   a pad block in the integrated circuit substrate;
   a plurality of input buffers in the integrated circuit substrate that buffer data input to the memory bank; and an input shift block coupled to the plurality of input buffers that provides data from the plurality of input buffers to the memory bank, the input shift block being directly adjacent to the input buffers in the integrated circuit substrate.

2. An integrated circuit memory device according to claim 1 further comprising:

a clock circuit in the integrated circuit substrate adjacent to at least one of the input buffers and the input shift block, the clock circuit having an input control clock output; and an input control clock line on the integrated circuit substrate extending from the input control clock output and positioned adjacent to the input buffers and the input shift block.

3. An integrated circuit memory device according to claim 2 wherein the input control clock line does not pass over the pad block.

4. An integrated circuit memory device according to claim 3 wherein the input buffers and the input shift block have a clock input that is responsive to the input control clock line.

5. An integrated circuit memory device according to claim 4 further comprising:

a plurality of output buffers in the integrated circuit substrate that buffer data for output to the pad block;

an output shift block coupled to the plurality of output buffers that provides data from the memory bank to the plurality of output buffers;

an output control clock line on the integrated circuit substrate extending from an output control clock output of the clock circuit and positioned adjacent to the output buffers and the output shift block.

6. An integrated circuit memory device according to claim 5 wherein the output buffers and the output shift block have a clock input that is responsive to the output control clock line.

7. An integrated circuit memory device according to claim 6 wherein the clock circuit comprises a delay locked loop circuit.

8. An integrated circuit memory device comprising:

a first memory bank in an integrated circuit substrate;

a pad block in the integrated circuit substrate;

a plurality of input buffers in the integrated circuit substrate that buffer data input to the first memory bank;

an input shift block coupled to the plurality of input buffers that provides data from the plurality of input buffers to the first memory bank, the input shift block being adjacent to the input buffers in the integrated circuit substrate, wherein the input buffers and input shift block define a first input buffer/shift block;

a clock circuit in the integrated circuit substrate adjacent to at least one of the input buffers and the input shift block, the clock circuit having an input control clock output, an input control clock line on the integrated circuit substrate extending from the input control clock output and positioned adjacent to the input buffers and the input shift block, wherein the first input buffer/shift block has a clock input that is responsive to the input control clock line;

a plurality of output buffers in the integrated circuit substrate that buffer data for output to the pad block;

an output shift block coupled to the plurality of output buffers that provides data from the first memory bank to the plurality of output buffers wherein the output buffers and output shift block define a first output buffer/shift block;

an output control clock line on the integrated circuit substrate extending from an output control clock output of the clock circuit and positioned adjacent to the output buffers and the output shift block, wherein the the first output buffer/shift block have a clock input that is responsive to the output control clock line;

a second memory bank;

a second input buffer/shift block associated with the second memory bank and having a clock input that is responsive to the input control clock line;

a second output buffer/shift block associated with the second memory bank and having a clock input that is responsive to the output control clock line;

wherein the input control clock line is positioned adjacent to the second input buffer/shift block and the output control clock line is positioned adjacent to the second output buffer/shift block; and wherein the first input buffer/shift block and the first output buffer/shift block are associated with at least one of the first memory bank and the second memory bank.

9. An integrated circuit memory device according to claim 8 wherein the first output buffer/shift block is adjacent to the second output buffer/shift block.

10. An integrated circuit memory device according to claim 9 wherein the clock circuit is between the first input buffer/shift block and the second input buffer/shift block.

11. An integrated circuit memory device according to claim 10 wherein the pad block is between the first and second output buffer/shift blocks and the first and second input buffer/shift blocks.

12. An integrated circuit memory device according to claim 8 wherein the output clock line does not pass over the pad block.

13. An integrated circuit memory device according to claim 12 wherein first input buffer/shift block and the first output buffer/shift block define a first input/output block and the second input buffer/shift block and the second output buffer/shift block define a second input/output block and the clock circuit is positioned between the first input/output block and the second input/output block.

14. An integrated circuit memory device according to claim 13 wherein the integrated circuit memory device is a Rambus memory device.

15. A Rambus memory device comprising a first memory bank in an integrated circuit substrate;

a second memory bank in the integrated circuit substrate;

a pad block in the integrated circuit substrate between the first memory bank and the second memory bank;

a first input buffer/shift block including a plurality of input buffers in the integrated circuit substrate coupled to the pad block that buffer data input to the pad block and an input shift block coupled to the plurality of input buffers that provides data from the plurality of input buffers to the first memory bank, the first input buffer/shift block being between the first memory bank and the pad block;

a second input buffer/shift block electrically coupled to the second memory bank and including a plurality of input buffers in the integrated circuit substrate coupled to the pad block that buffer data input to the pad block and an input shift block coupled to the plurality of input buffers that provides data from the plurality of input buffers to the second memory bank, the second input buffer/shift block being between the first memory bank and the pad block;

a delay locked loop circuit in the integrated circuit substrate between the first memory bank and the pad block and having an input control clock output; and an input control clock line on the integrated circuit substrate extending from the input control clock output, the input control clock line positioned between the first memory bank and the pad block.

16. A Rambus memory device according to claim 15 wherein the input control clock line does not pass over the pad block.

17. A Rambus memory device according to claim 15 further comprising:

a first output buffer/shift block including a plurality of output buffers in the integrated circuit substrate coupled to the pad block that buffer data for output to the pad block and an output shift block coupled to the plurality of output buffers that provides data from the first memory bank to the first plurality of output buffers;

a second output buffer/shift block including a second plurality of output buffers in the integrated circuit substrate coupled to the pad block that buffer data for output to the pad block and a second output shift block coupled to the second plurality of output buffers that provides data from the second memory bank to the second plurality of output buffers; and an output control clock line on the integrated circuit substrate extending from an output control clock output of the delay locked loop circuit.

18. A Rambus memory device according to claim 17 wherein the first output buffer/shift block is adjacent to the second output buffer/shift block.

19. A Rambus memory device according to claim 18 wherein the delay locked loop circuit is positioned between the first input buffer/shift block and the second input buffer/shift block.

20. A Rambus memory device according to claim 19 wherein the pad block is positioned between the first and second output buffer/shift blocks and the first and second input buffer/shift blocks.

* * * * *